US010028595B2

(12) United States Patent
Rau

(10) Patent No.: US 10,028,595 B2
(45) Date of Patent: Jul. 24, 2018

(54) DISPLAY UNIT, IN PARTICULAR FOR PRODUCTS

(71) Applicant: GESA Form + Funktion Displaybau GmbH, Dreieich-Offenthal (DE)

(72) Inventor: Otmar Rau, Dreieich-Goetzenhain (DE)

(73) Assignee: GESA FORM + FUNKTION DISPLAYBAU GMBH (DE)

(*) Notice: Subject to any disclaimer, the term of this patent is extended or adjusted under 35 U.S.C. 154(b) by 55 days.

(21) Appl. No.: 14/993,348

(22) Filed: Jan. 12, 2016

(65) Prior Publication Data
US 2016/0206118 A1 Jul. 21, 2016

(30) Foreign Application Priority Data
Jan. 16, 2015 (DE) .................. 10 2015 000 272

(51) Int. Cl.
A47F 3/14 (2006.01)
A47F 5/08 (2006.01)
(Continued)

(52) U.S. Cl.
CPC ............ *A47F 3/14* (2013.01); *A47F 3/001* (2013.01); *A47F 5/0025* (2013.01);
(Continued)

(58) Field of Classification Search
CPC .......... A47F 3/14; A47F 3/001; A47F 5/0025; A47F 5/0846; A47F 5/0853; A47F 11/10; H05K 7/1414
See application file for complete search history.

(56) References Cited

U.S. PATENT DOCUMENTS 5,881,892 A * 3/1999 Loo .................. A47F 5/0025
211/126.13
5,988,410 A 11/1999 Mandle
(Continued)

FOREIGN PATENT DOCUMENTS

DE 698 07 704 8/2003
DE 20 2012 009 052 12/2012
(Continued)

OTHER PUBLICATIONS

European Search Report dated May 11, 2016.
German Search Report dated Sep. 30, 2015.

*Primary Examiner* — Bao Q Truong
(74) *Attorney, Agent, or Firm* — Gerald E. Hespos; Michael J. Porco; Matthew T. Hespos

(57) ABSTRACT

A display unit for products has a mounting frame (10) with mounting profiles (12, 11; 14) disposed parallel and spaced apart from one another. Frame-shaped or box-shaped inserts (30) are fastened releasably to the mounting profiles. The inserts (30) have side walls (31) that form a rectangular frame, and the inserts are fastened releasably by their rear faces on the mounting profiles. Due to the fastening an electrical voltage is supplied simultaneously to the inserts. The inserts can be modules that are fastened individually to the mounting frame and each can be designed differently. The respective inserts are fastened releasably by their rear faces on the mounting profiles. Thus the display unit can be configured variably in a simple manner both in the case of conversions and also in the case of new constructions in sales premises.

20 Claims, 19 Drawing Sheets

(51) Int. Cl.
  *A47F 11/10* (2006.01)
  *A47F 3/00* (2006.01)
  *A47F 5/00* (2006.01)
  *H05K 7/14* (2006.01)

(52) U.S. Cl.
  CPC .......... *A47F 5/0846* (2013.01); *A47F 5/0853* (2013.01); *A47F 11/10* (2013.01); *H05K 7/1414* (2013.01)

(56) References Cited

U.S. PATENT DOCUMENTS

| | | | |
|---|---|---|---|
| 7,163,305 B2 * | 1/2007 | Bienick | A47B 97/00 362/125 |
| 8,061,539 B2 | 11/2011 | Punzel et al. | |
| 2007/0221595 A1 | 9/2007 | Chen | |
| 2008/0121146 A1 * | 5/2008 | Burns | A47F 5/101 108/23 |
| 2011/0204009 A1 * | 8/2011 | Karan | A47F 1/12 211/59.2 |
| 2013/0068171 A1 | 3/2013 | Lee | |
| 2014/0104826 A1 | 4/2014 | Bergdoll | |
| 2015/0070928 A1 | 3/2015 | Rau | |

FOREIGN PATENT DOCUMENTS

| | | |
|---|---|---|
| DE | 20 2013 104 137 | 11/2013 |
| DE | 20 2014 103 767 | 12/2014 |
| EP | 0 773 727 | 5/2000 |
| EP | 2220965 A2 | 8/2010 |
| WO | 2006/067396 | 6/2006 |

* cited by examiner

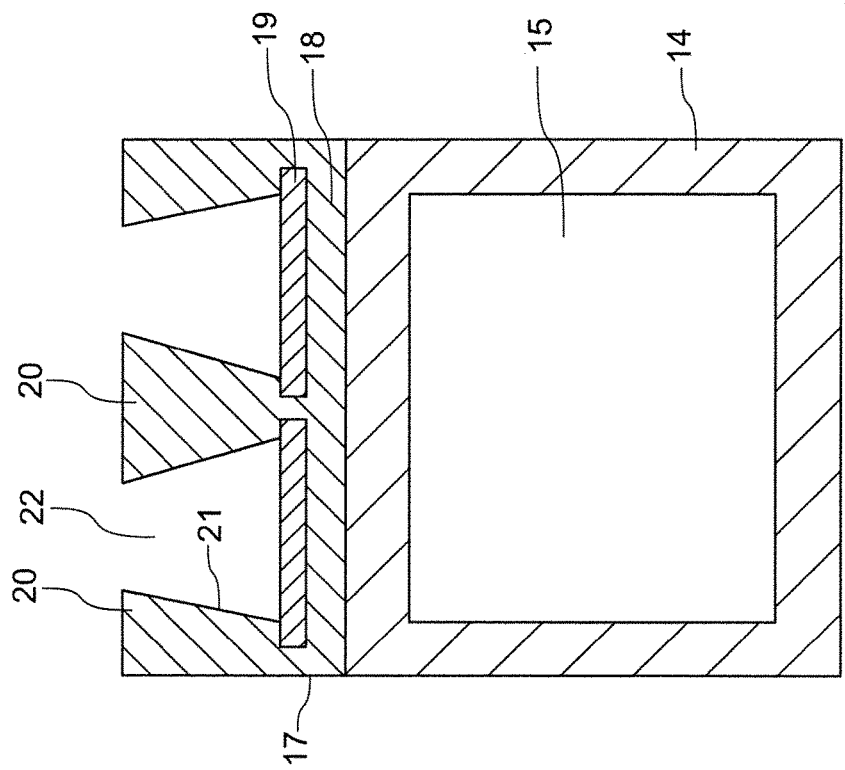

DISPLAY UNIT, IN PARTICULAR FOR PRODUCTS

BACKGROUND

1. Field of the Invention

The invention relates generally to the display of products, such as for example cosmetic articles or text and/or graphics information for advertising purposes in connection with any products/services and relates in particular to a display unit with a plurality of display modules that should be capable of variable configuration in a simple manner both in the case of conversion and also in the case of new constructions in sales premises.

2. Description of the Related Art

Display units of the aforementioned type for products are set up as part of sales counters, also referred to as displays, in sales premises such as for example supermarkets or chemist's shops and offer the possibility of displaying a specific product, for example a cosmetic product, to the customer. The finished system as part of a display is set up for example in a chemist's shop, department store, perfumery, etc. and displays products (for example cosmetic articles) for sale to the final consumer. The final product is available with different visual appearances according to customer requirements.

Suppliers of cosmetic products often have their own display units in sales areas in which they display their products in a uniform manner. Display systems with modules are required as part of the displays, in order on the one hand to accommodate the products and on the other hand to display them.

In the past, bases for display systems have been produced individually from metal, wood and plastic and generally are not customisable to customer requirements. Conversions of existing designs have not generally been possible, or have been very awkward.

Especially for the display of products, attractively designed modules are sought which on the one hand can be produced cost-effectively and so as to be flexibly configurable and on the other hand are sufficiently robust.

WO 2006067396 A1 and DE 202014103767 U1 disclose a display unit with a plurality of shelves arranged one above the other, for more promotionally effective display of products the shelves are provided with illumination devices. The electrical supply to these illumination devices takes place by means of the fastening of the shelves on a wall panel or a supporting column.

DE 202012009052 U1 discloses a display unit with a plurality of panels on which products to be displayed are set out on the front face. The panels are releasably fastened to a further panel or a wall with the aid of a fastening frame or fastening elements.

For the ordered display of products, variable sub-divisions in the shape of intersecting strips are generally used which are disposed on the upper face of shelves or the like, as disclosed for example in EP 0773727 B1, For more effective and more attractive display of products, especially in the field of cosmetic articles, display units have proved worthwhile which are provided with shelf plates made from a transparent material, such as for example transparent plastic, which enable a background lighting function for background lighting for the products to be displayed. In this case the shelf plates act as optical fibres from which the light for background lighting of the products is coupled out in a suitable manner. Such display units are disclosed for example in German Utility Model 202013104137 in the name of the applicant.

SUMMARY OF THE INVENTION

The object of the present invention is to provide an improved display unit with a plurality of display modules, which are electrified or not electrified, so that the display unit should be capable of variable configuration in a simple manner both in the case of conversions and also in the case of new constructions in sales premises.

A display unit according to the present invention serves for the display of products and/or from text and/or graphics information. The display unit comprises a mounting frame with a plurality of mounting profiles that are disposed parallel and spaced apart from one another. The mounting profiles advantageously are constructed as continuous profiles with suitable lengths that are spaced apart at regular intervals and are disposed parallel to one another. In particular the mounting profiles can be disposed so that they intersect horizontally and perpendicularly to form a plurality of mounting zones, the sizes of which are advantageously the same, but can also differ by an integral multiple from one another in one or two dimensions, and alternatively other differences are also possible. Plural frame-shaped or box-shaped inserts are fastened releasably to the mounting profiles, and each functions to display products and/or text and/or graphics information. The inserts each have a plurality of side walls, which altogether make a very stable and resilient rectangular frame possible.

According to the invention the inserts can be regarded as modules that are fastened individually to the mounting frame and can each be differently designed. In this case the inserts in each case are fastened releasably by their rear faces on the mounting profiles. Thus the display unit can be configured variably in a simple manner both in the case of conversions and also in the case of new constructions in sales premises.

All the inserts advantageously have the same basic dimensions, or they are divided in a modular manner by sizes, so that the size corresponds to a multiple or an integral fraction of the module size, so that the modules can be mounted, for example stacked and transported, in a simple manner and can be replaced easily by another one, for example having a different functionality.

According to a preferred embodiment the inserts are connected directly to the mounting profiles by the rear faces of the side walls of the inserts, wherein the base surfaces of the modules advantageously correspond to the base surfaces of the mounting zones of the mounting frame or an integral multiple or a fraction thereof. Thus the inserts do not project, or project only insignificantly, beyond the zones of the mounting frame defined by the mounting profiles. Thus by the arrangement of the mounting profiles the later arrangement of the inserts can be defined in a simple manner, for example in a matrix arrangement in rows and columns, wherein the inserts themselves can always be fastened in the same way by simple connections to the mounting profiles, and overall this helps to reduce the time necessary for mounting.

According to a further embodiment conductive tracks are disposed on at least several of the mounting profiles and may be configured as metal rails and/or plastic rails that face the rear face of the inserts and are directly accessible therefrom. In this case the releasable fastening of the inserts to the mounting profiles advantageously is designed so that the inserts are supplied via the conductive tracks with a supply voltage, for example a low-volt d.c. voltage, when the inserts are fastened releasably to the mounting profiles. In other words: when the inserts are fastened to the mounting profiles an electrical power supply to the inserts is implemented automatically by means of the conductive tracks, so that expensive additional steps for electrification of the inserts can be omitted according to the invention. In particular lighting devices, such as LED strips or illumination means, and/or electrical equipment, such as display screens, music players and the like that are provided in the inserts, can be operated with the aid of the supply voltage. For this purpose, electrical cables or conductive tracks as well as connecting means, such as plugs or terminal blocks, can also be provided in the inserts, for example in the side walls of the inserts.

In the case of a matrix arrangement of the mounting zones of the mounting frame, as stated above, it may be sufficient if the conductive tracks only extend along the horizontal or vertical mounting profiles. It may be sufficient if the conductive tracks are provided only on the respective second conductive track of the group of conductive tracks of one type (horizontal or vertical).

According to a further embodiment contact pins are provided on the rear faces of the inserts and are pressed automatically against the conductive tracks when the inserts are fastened releasably to the mounting profiles. For this purpose the contact pins, in a loosened normal state, can project slightly beyond the plane that is spanned by the rear face or the frame of the inserts and, in a mounted state, by a restoring element, such as a spring or a sheet metal strip, are pressed against the associated conductive tracks.

According to a further embodiment fastening elements that are designed for fastening of the rear end faces of the side walls of the inserts to the mounting profiles, are fastened on each of the front faces, so that the inserts do not project, or project only insignificantly, beyond the zones of the mounting frame defined by the mounting profiles. In this case the fastening elements have longitudinal grooves which extend in the longitudinal direction of the respective mounting profiles and in which the conductive tracks are disposed. The connection of the inserts to the mounting profiles preferably takes place through a positive locking or frictional connection within the longitudinal grooves or in the immediate vicinity. At the same time the electrical power supply to the inserts is ensured by the conductive tracks disposed in the longitudinal grooves. In this way according to the invention a very compact and space-saving mounting of a plurality of variably configurable display modules (inserts) on a mounting frame can be ensured.

According to a preferred further embodiment the rear end faces of the side walls are in each case connected by positive locking to the fastening elements. In this case the positive locking is designed to prevent unintentional withdrawal of the display modules (inserts) vertically from the mounting frame. At the same time the display modules (inserts) can be positioned reliably in the plane defined by the mounting frame. The positive locking can be implemented by means of first positive-locking elements that are provided on the rear faces or rear end faces of the side walls of the inserts, and second positive-locking elements that are designed corresponding to the first elements and are provided directly on the mounting profiles or on fastening elements connected thereto. In this case the respective positive locking elements advantageously are designed in one piece with the respective insert of the associated side wall or with the mounting profile or the fastening element connected thereto, which can be achieved in a simple manner by plastic injection moulding processes.

According to a further embodiment latching catches are provided in each case on the rear end faces of the side walls and are inserted into the longitudinal grooves of the fastening elements and elastically pretensioned against inclinations or openings of the longitudinal grooves when the inserts are releasably fastened to the mounting profiles. Alternatively, latching recesses are provided in each case on the rear end faces of the side walls and interengage in the latching catches that are provided in the longitudinal grooves of the fastening elements and are pretensioned elastically against the latching recesses when the inserts are fastened releasably to the mounting profiles.

According to a further embodiment the fastening elements are in each case kept secured so as to be longitudinally movable on the mounting profiles. For this purpose for example the fastening elements can be designed as sliders or brackets around which the mounting profiles at least partially engage in each case and which are adjusted in the longitudinal direction of the mounting profiles and can be fastened in the suitable position by connecting means, such as for example screws or clips. In this way the basic configuration of the mounting frame and of zones defined by the mounting profiles can be variably predetermined in a simple manner. In this case at the same time the fastening elements can also serve as holders for holding the aforementioned conductive tracks on the mounting profiles.

According to a further embodiment, the mounting profiles are constructed in each case as rectangular or square continuous hollow profiles with a cavity, and the mounting profiles are connected to the mounting frame by electrical connectors that are in each case inserted into the cavities of two mounting profiles that are connected to one another. It is advantageous that the geometry of the mounting frame can be predetermined very variably in a simple manner by simple connection of a few mounting profiles with standard lengths. In this case the mounting frame can be constructed at the time of mounting on site, thereby further reducing the mounting and transport costs. Thus, 90° plug connectors, T plug connectors or similar connectors can be used to produce a matrix arrangement of the zones of the mounting frame with a plurality of horizontal mounting profiles extending parallel to one another and a plurality of vertical mounting profiles extending perpendicular thereto and parallel to one another. However, if the plug connector predetermines other angles, any other geometry can be produced, in particular any angle of inclination of part-sections of the display unit, for example a rear wall or a lower section thereof.

According to a further embodiment at least some of the inserts have rear walls so as to be able to prevent products for display from falling out and thus the inserts are designed for retaining and/or holding products which are to be displayed. Liner bases advantageously can be inserted as required into the side walls or retaining projections provided there.

According to a further embodiment the rear wall comprises a light-conducting plate that can be formed directly by the rear wall. Light from a LED strip can be coupled into the light-conducting plate for background lighting. The products received or held in the display module (insert) can be displayed in a more promotionally effective manner by the background lighting. Alternatively the background lighting serves for promotionally effective illumination of text and/or graphics information. For this purpose the front faces of at least some of the inserts can be covered by a transparent or opaque covering made, for example, from a transparent or opaque plate-like plastic. The covering may be designed to present text and/or graphics information.

In a further embodiment the mounting frame is disposed on a ramp-like body, so that the mounting frame is fastened to lie obliquely. This enables the products standing farther back to be raised for the viewer, so that the viewer sees them better.

In a preferred embodiment the mounting frame is formed like a ladder with horizontal and vertical mounting profiles. The box-shaped inserts may be disposed in the ladder zones.

In this case the horizontal and vertical mounting profiles are preferably connected to one another by clamping, wherein the horizontal mounting profile is preferably made from plastic and extends in part so as to clamp around the vertical mounting profile.

A display unit such as is disclosed here can be received on a mounting frame in a piece of display furniture or can be fastened on a wall panel.

The invention is described hereafter by way of example and with reference to the appended drawings, which disclose further features, advantages and objects to be achieved.

BRIEF DESCRIPTION OF THE DRAWINGS

FIG. 4a shows a schematic sectional view of a mounting profile according to one embodiment.

FIG. 16 shows an exploded view of FIG. 15 with a view of a detail of a top region of a horizontal mounting profile which is clipped on.

In the drawings identical references designate identical elements or groups of elements.

DETAILED DESCRIPTION OF THE PREFERRED EMBODIMENTS

Figure 1:
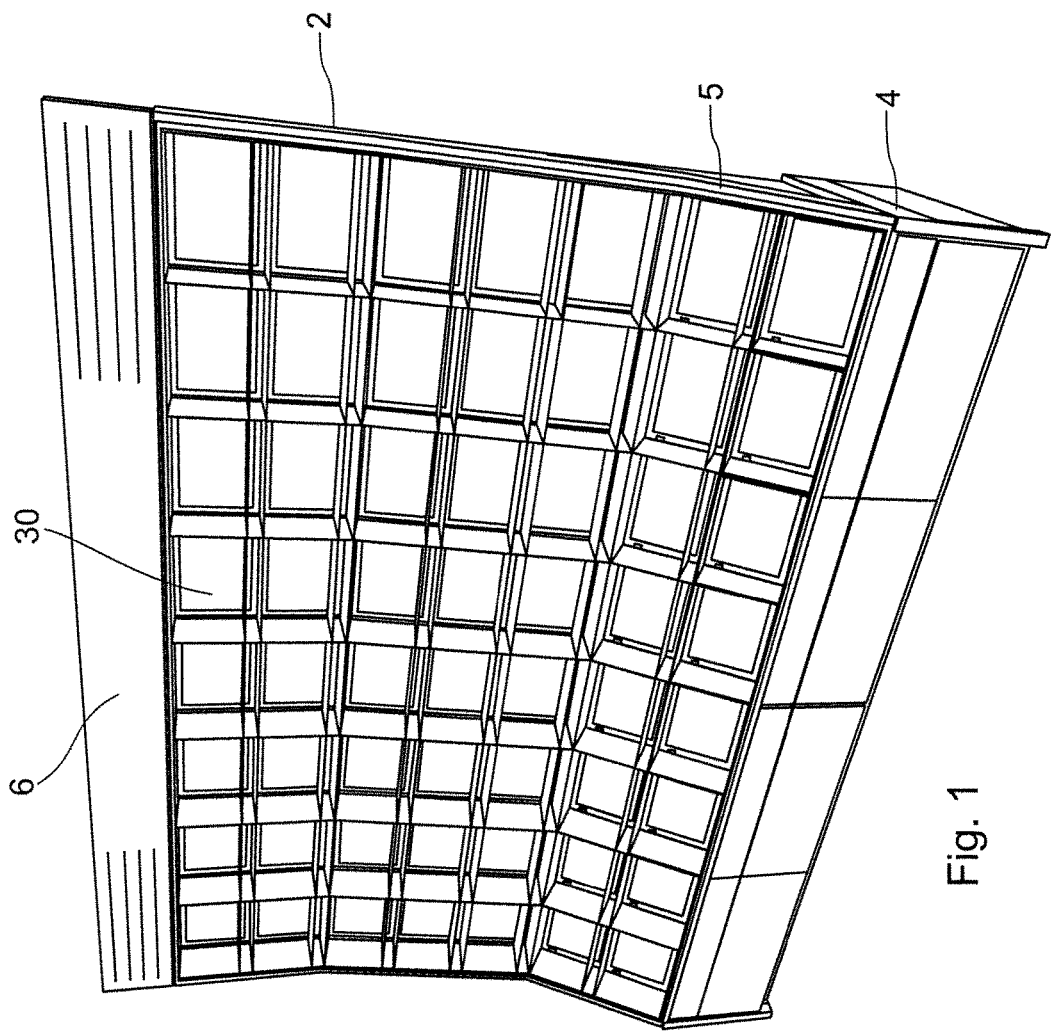
FIG. 1 shows a display unit for products according to the present invention.

FIG. 1 shows a display unit for products according to the present invention. The display unit comprises a plurality of box-shaped inserts 30 with a rectangular base surface that are disposed in a matrix arrangement and are inserted into the mounting frame, which is illustrated in FIG. 2, and is accommodated in a piece of display furniture 2 having a horizontally extending carcass 4 with a plurality of drawers, vertical side walls 5 and an upper advertising space 6 for presentation of text and/or graphics information.

Figure 2:
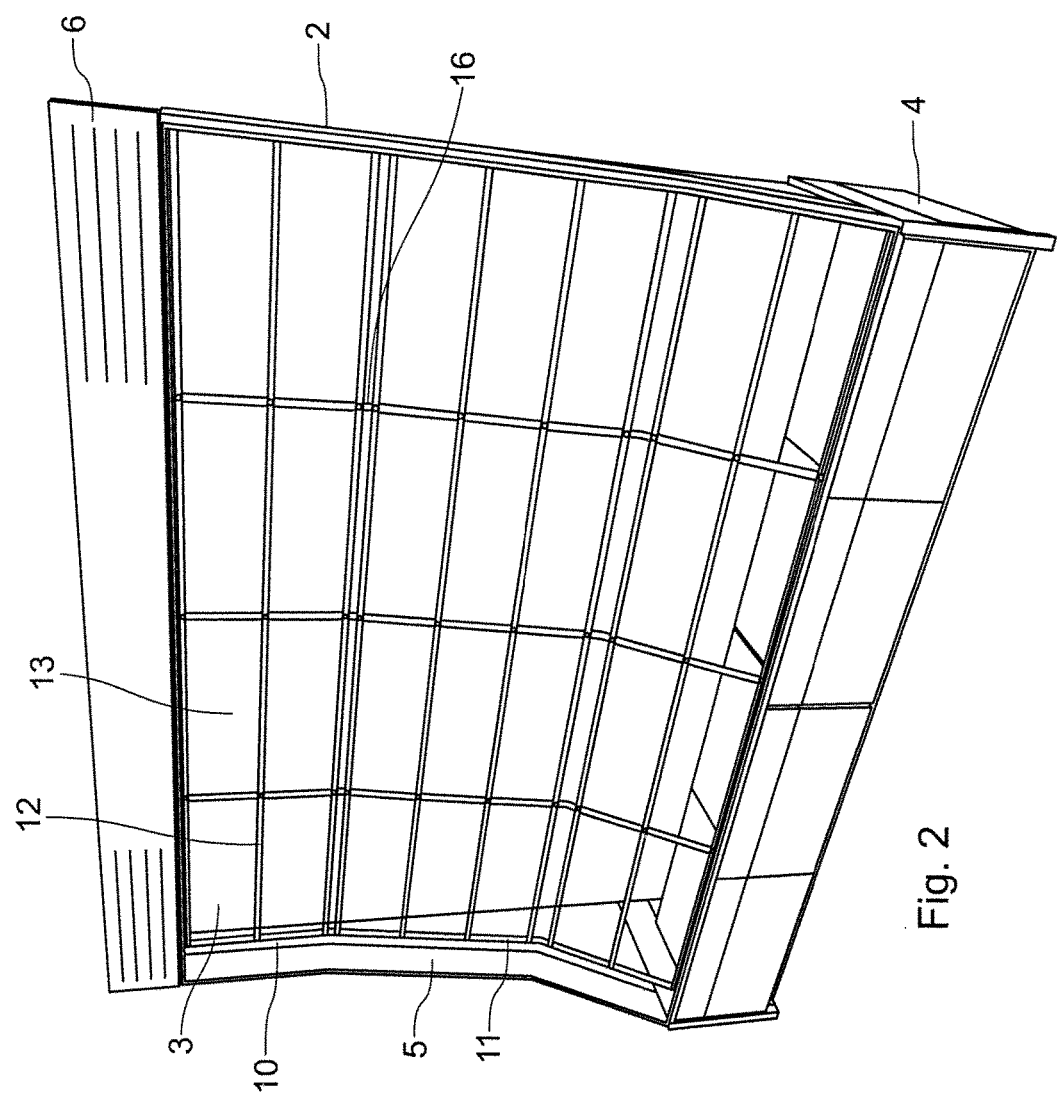
FIG. 2 shows a mounting frame of the display unit according to FIG. 1, which is installed in a piece of display furniture.

FIG. 2 shows the arrangement of the mounting frame 10 inside the piece of display furniture 2. The mounting frame 10 is formed by a plurality of horizontal mounting profiles 12 and mounting profiles 13 extending perpendicular thereto and connected to one another by plug connectors 16, as is explained in greater detail below with reference to FIG. 4d. The mounting frame 10 is divided by the mounting profiles 11, 12 into a plurality of zones 13 of the same size, of which the height/width substantially corresponds to an integral multiple of the height/width of the inserts 30 that are to be fastened to the mounting frame 10. Naturally the mounting profiles 11, 12 can also fix different sub-divisions of the mounting frame 10 section by section.

According to FIG. 2 only the upper section of the mounting frame 10 extends parallel to the rear wall 3 of the piece of display furniture 2. The central and lower sections of the mounting frame 10 each extend at an acute angle to the plane of the upper section of the mounting frame 10. The respective angle can be set in a simple manner by means of the plug connector 16, by means of which the mounting profiles 11, 12 in each case are connected to one another, as is explained in greater detail with reference to FIG. 4d.

Figure 3:
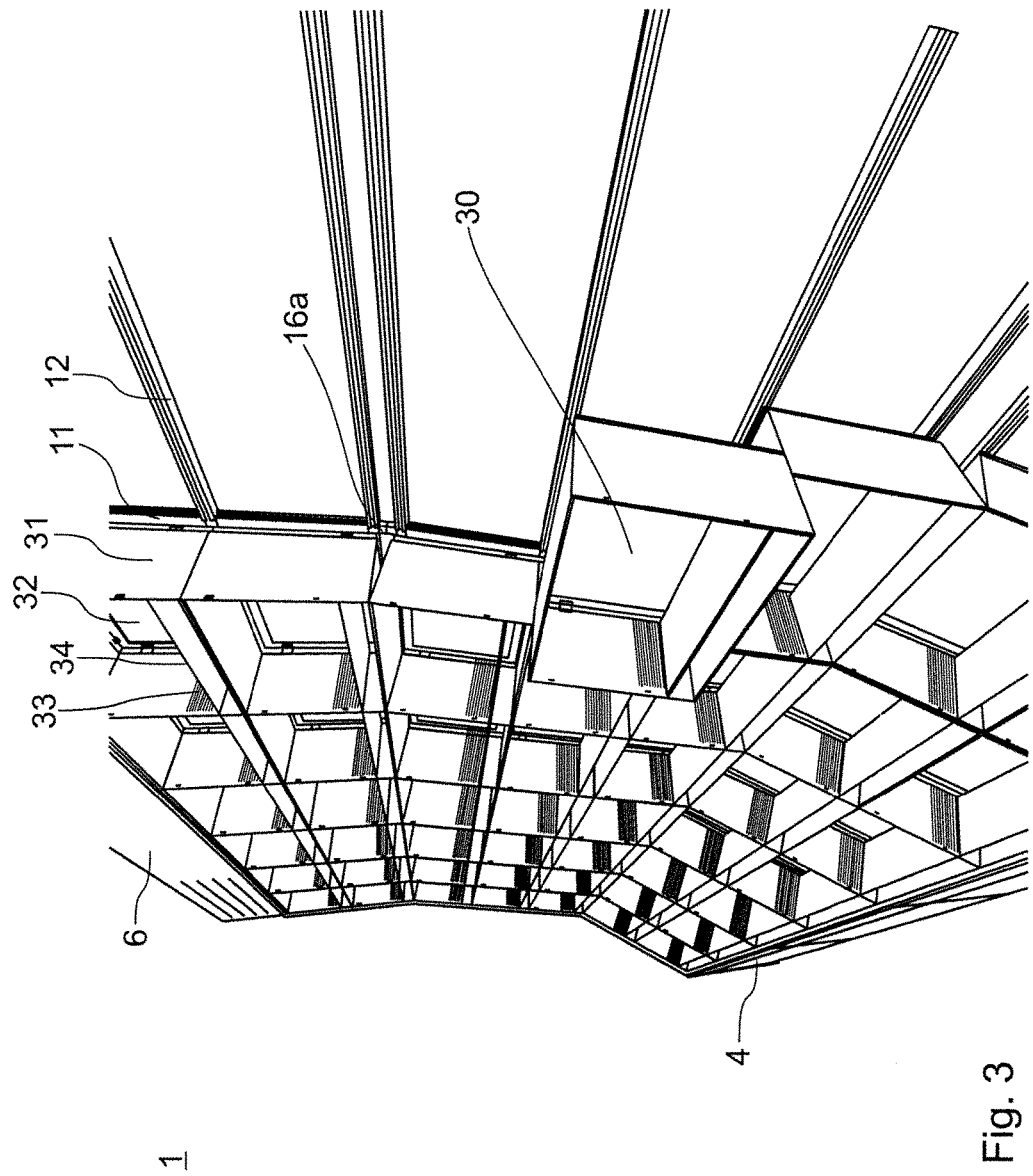
FIG. 3 shows the mounting frame of the display unit according to FIG. 2 in a perspective partial side view, wherein a plurality of box-shaped inserts is fastened on the mounting frame.

FIG. 3 shows the mounting frame of the display unit according to FIG. 2 in a perspective partial side view. In this case not all of the inserts 30 are fastened to the mounting frame. The insert designated by the reference numeral 30 is moved closer to the mounting frame to be fastened thereto. According to FIG. 3 the inserts 30 are box-shaped, with a rear wall 32 and four side walls 31. A plurality of retaining projections 33, into which at least one liner base 34 can be inserted for supporting products to be displayed, are provided in a grid arrangement on the inner faces of the vertical side walls 31.

Further inserts can also be designed in the form of a frame, that is to say without a rear wall, to enable a free view through for instance onto the rear wall 3 of the piece of display furniture 2 located behind it (cf. FIG. 2), a wall or an advertisement.

FIG. 4a shows further details of the mounting profile 14, which, according to this embodiment, has a square cross-section and has a cavity 15 at least in the end regions and preferably over the entire length thereof. Such a mounting profile 14 can be cut off with a suitable length from extruded continuous profiles of plastic and/or metal. The front face of the mounting profile 14 faces the associated insert (not shown) and has a conductive track holder 17 that serves as a fastening element for fastening of an insert 30 to the mounting profile 14 and either is fastened to the mounting profile 14 or is constructed in one piece therewith. According to FIG. 4a two electrically conductive tracks 19 are disposed so as to be insulated from one another in the longitudinal grooves 22 of the conductive track holder 17. The conductive tracks 19 for contact pins 36 (cf. FIG. 5a and FIG. 5b) of the associated insert 30 are directly accessible via the longitudinal grooves 22.

In the arrangement according to FIG. 3 the conductive tracks can extend over the entire width and/or height of the mounting frame 10, or over the width and/or height of a sub-section thereof, which is to be supplied with an electrical voltage.

According to the invention the releasable fastening of the inserts 30 to the mounting profiles 14 is advantageously designed so that the inserts 30 are supplied automatically via the conductive tracks 19 with a supply voltage when the inserts 30 are fastened releasably to the mounting profiles 14. The inserts 30 can be fastened to the mounting profiles 14 by basically any connection techniques, such as screw connections, hook and loop fastenings, releasable adhesive joints or any suitable positive locking or frictional connection techniques.

Positive locking structures are provided particularly advantageously on the front face of the mounting profile 14, which faces the insert (not shown). These structures can either be formed directly on the front face of the mounting profile 14 or directly in the conductive track holder 17, as shown in FIG. 4a. More precisely the longitudinal grooves 22 of the conductive track holder 17 are in the form of an inverted V according to FIG. 4a and have obliquely upwardly inclined slopes 21 which converge upwards towards one another. Corresponding latching catches, which are formed on the rear face of the associated insert, in particular on the rear end faces of the side walls thereof, engage in the longitudinal grooves 22.

Figure 6:
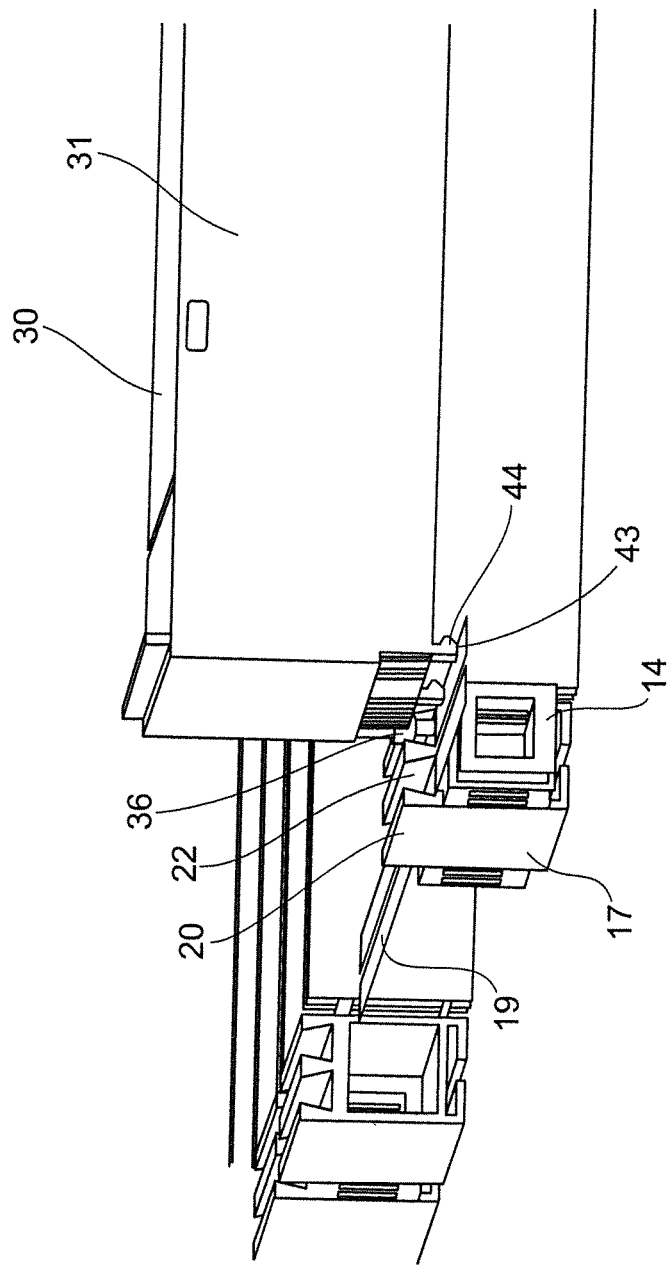
FIG. 6 shows a perspective partial view of the process of fastening a box-shaped insert to a mounting profile according to the present invention.

An example of such a latching catch 43 is shown in FIG. 6. According to FIG. 6 the latching catches 43 are formed in one piece with the side wall 31 of the respective insert 30 and project in the extension thereof from the rear face of the insert 30. Each latching catch 43 has a slope 44. During the insertion of the latching catch 43 into a longitudinal groove 22 of the mounting profile 14 the slope 44 bears fully or in part against the slope 21 of the longitudinal groove 22 to secure the insert 30 on the associated mounting profile against removal perpendicular to the mounting profile.

More precisely, the front end of the slope 44 of the latching catch 43 initially contacts the front end of the projection 20 of the conductive track holder 17 during the insertion of the latching catch 43 into a longitudinal groove 22 of the mounting profile 14. As the latching catch 43 is introduced further into the longitudinal groove 22, the slope 44 of the latching catch 43 slides along the front end of the projection 20, until finally the slope 44 of the latching catch 43 bears fully or in part against the slope 21 of the longitudinal groove 22. The upper face of the latching catch 43 also is chamfered to simplify the removal of the latching catch 43 from the longitudinal groove 22.

It can be seen from FIG. 6 that the conductive track holder 17 does not need to extend over the entire length of the mounting profile 14, but that it may be sufficient if it is only disposed thereon in part, co-ordinated with the respective grid of the mounting frame. For even greater variability it may be advantageous in this case if the conductive track holder 17 can be moved along the respective mounting profile 14 and can finally be fastened at a suitable position, co-ordinated with the respective grid of the mounting frame to be formed, for example by means of suitable screw, plug or clip connections.

Figure 4C:
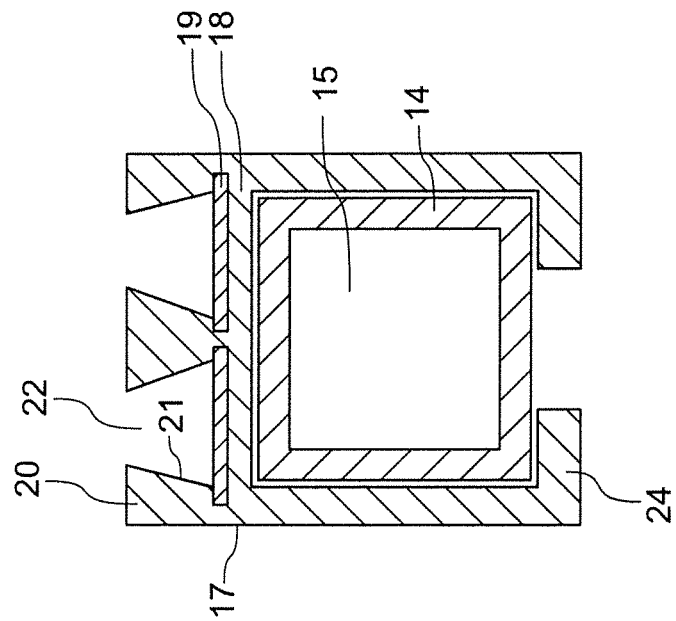
FIG. 4c shows a schematic sectional view of a mounting profile according to a further embodiment.
Figure 4B:
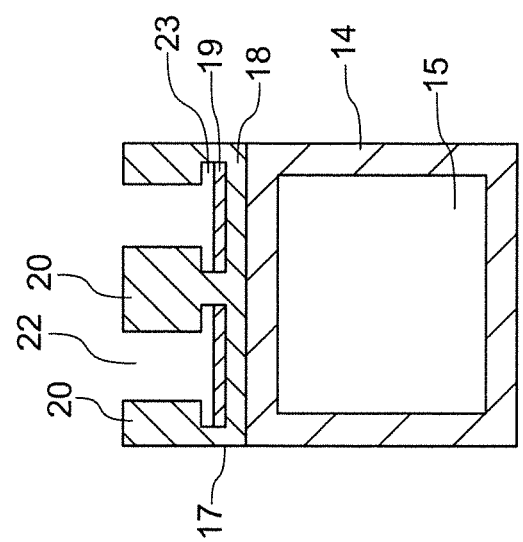
FIG. 4b shows a schematic sectional view of a mounting profile according to a further embodiment.

FIG. 4b shows a variant of a mounting profile. According to FIG. 4b the longitudinal grooves 22 are not wedge-shaped but in the form of an inverted T shape, with rectangular cutouts 23 above the conductive tracks 19 in which latching catches corresponding thereto can engage.

FIG. 4c shows a further variant of a mounting profile, according to which the conductive track holder 17 engages like a clamp around the mounting profile 14 by means of projections 24 at the opposite end. The frictional grip between the conductive track holder 17 and the mounting profile 14 can be sufficiently dimensioned for reliable positioning of the insert on the mounting profile 14 and at the same time, when a minimum force is exceeded, can ensure the above-mentioned movability of the conductive track holder 17 along the mounting profile 14.

Figure 4D:
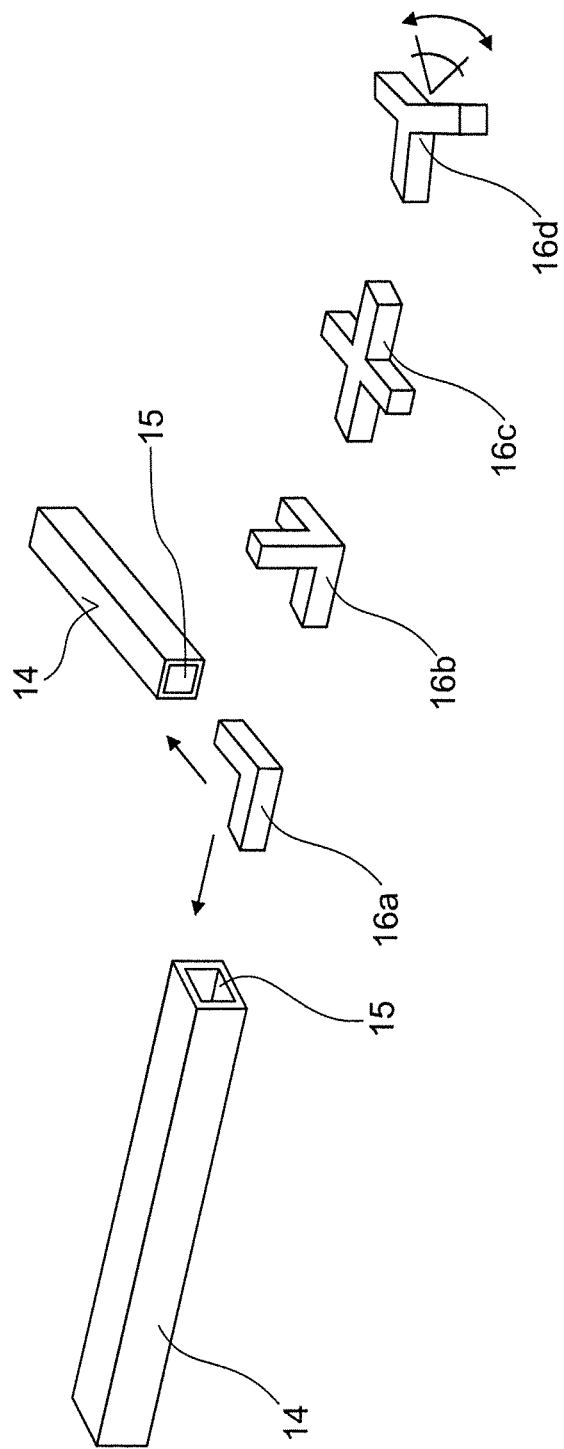
FIG. 4d shows a schematic view of the assembly of the mounting profiles to form a mounting frame.

FIG. 4d shows how mounting profiles 14 constructed as hollow profiles can be fit together by plug connectors 16a-16d that are inserted respectively into the cavities 15 of two mounting profiles 14 that are connected to one another to form a mounting frame with variable geometry. The geometry of the mounting frame can be predetermined in particular in a simple but reliable manner by the angle of the plug connectors 16a-16d used in each case.

Figure 5A:
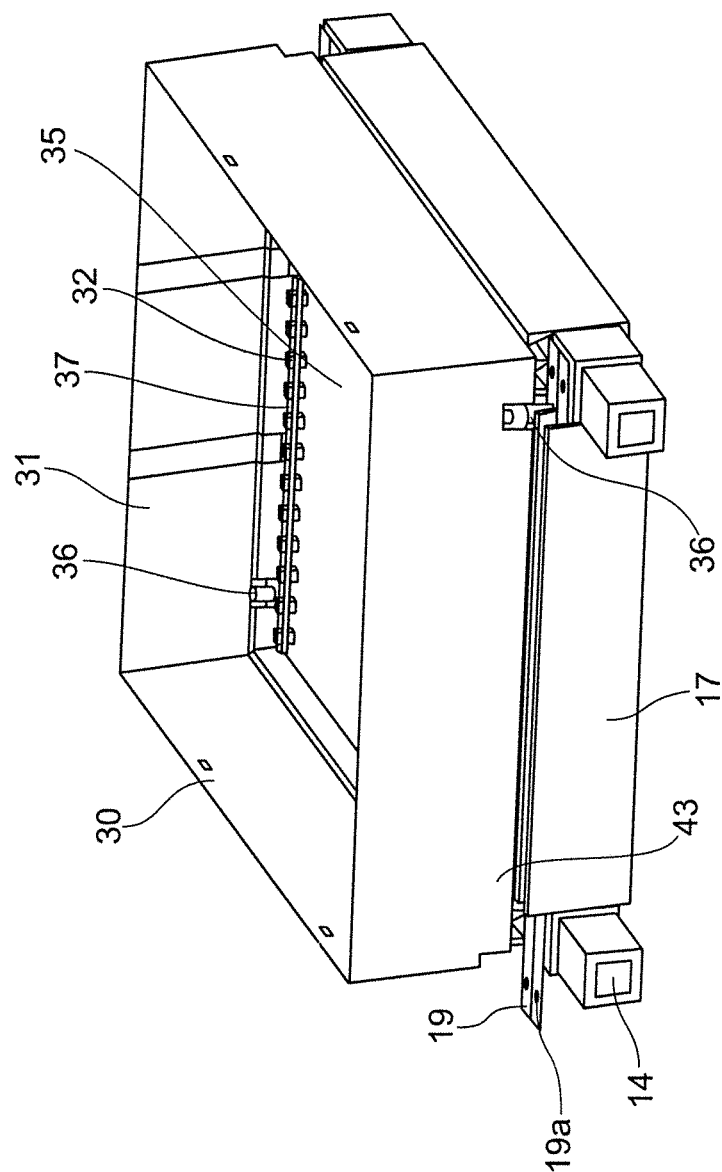
FIG. 5a shows a perspective partial view of the fastening of a box-shaped insert with background lighting to a zone of a mounting frame of a display unit for products according to the present invention.
Figure 5B:
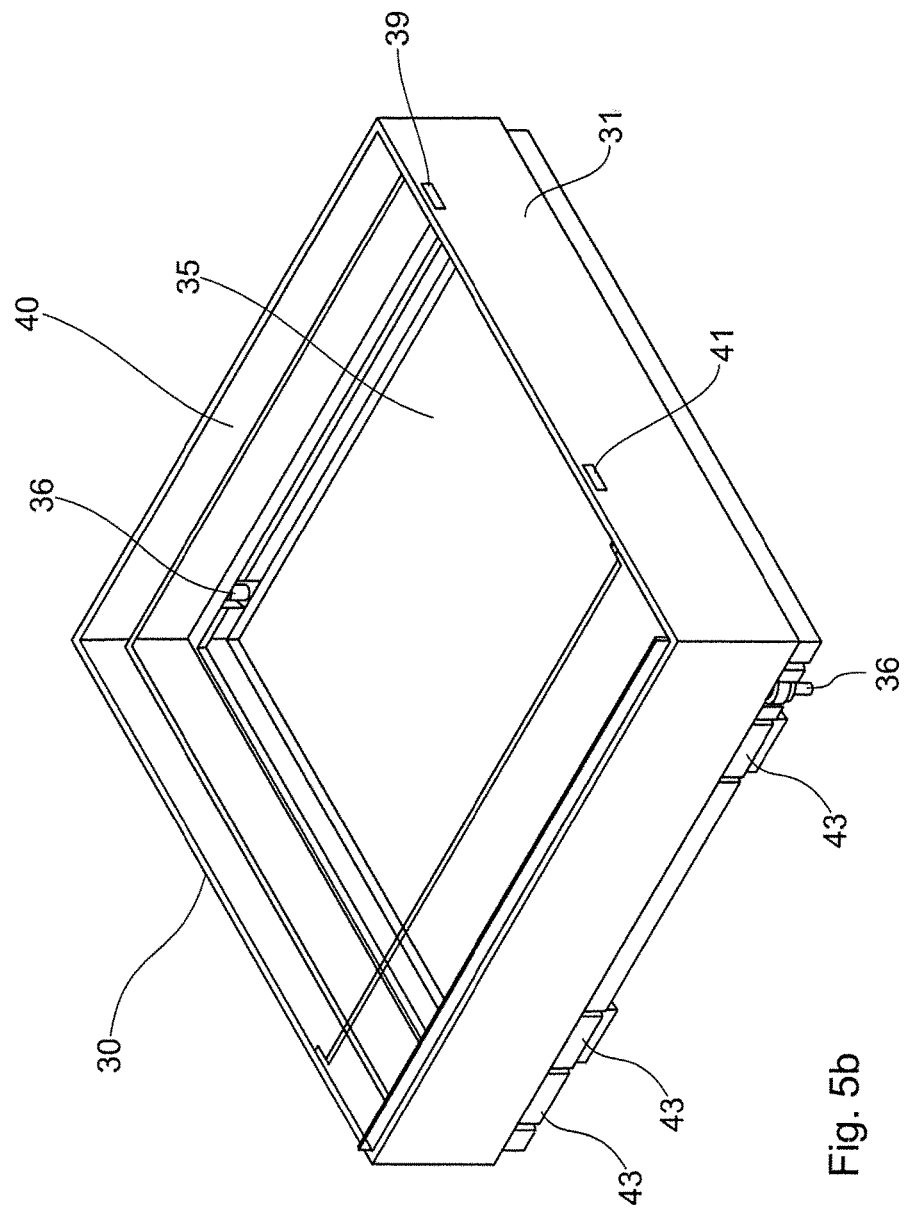
FIG. 5b shows a further example of a box-shaped insert.

FIG. 5a shows a perspective partial view of the fastening of a box-shaped insert with background lighting to a zone of a mounting frame as previously described. When the latching catches 43 of the insert 30 are inserted into the longitudinal grooves 22 of the conductive track holders 17 (cf. FIG. 6), the electrical contact pins 36 of the insert 30 press against the respective conductive tracks 19, so that electrical power is supplied for background lighting by coupling in of the light from a LED strips 37 with a plurality of LEDs 38 into the end face of the light-conducting plate 35. The light-conducting plate 35 can simultaneously form the rear wall of the insert 30. By means of the background lighting, articles disposed on the side wall 31 of the insert or on liner bases or the like can be illuminated in a promotionally effective manner or text and/or graphics information can be back-lit. For this purpose the front face of the insert 30 can also be covered by a transparent or opaque covering 40, on which the text and/or graphics information to be presented is provided in the known manner, as illustrated in FIG. 5b. This text and/or graphics information can also be inserted into a receptacle 42 of the covering 40. According to FIG. 5b the covering 40 is fastened to the insert 30 by insertion of projections 41 formed thereon into cutouts 39 in the side wall 31 of the insert 30.

The aforementioned electrical power supply to the insert can also serve for electrical power supply to any other illumination means or illumination devices or electrical equipment, for example display screens or music players, which are fastened in or on the insert.

As shown in FIG. 5a, holes 19a are provided in the conductive tracks 19. When the insert 30 is fastened to the mounting profiles 14, the contact pins 36 can also engage by positive locking in these holes 19a to produce the electrical contact. In this connection the holes 19a can be designed in the required pattern of the inserts 30 on the conductive tracks 19. The holes 19a can also serve for connection of two conductive tracks 19, for example by screwing.

Figure 7:
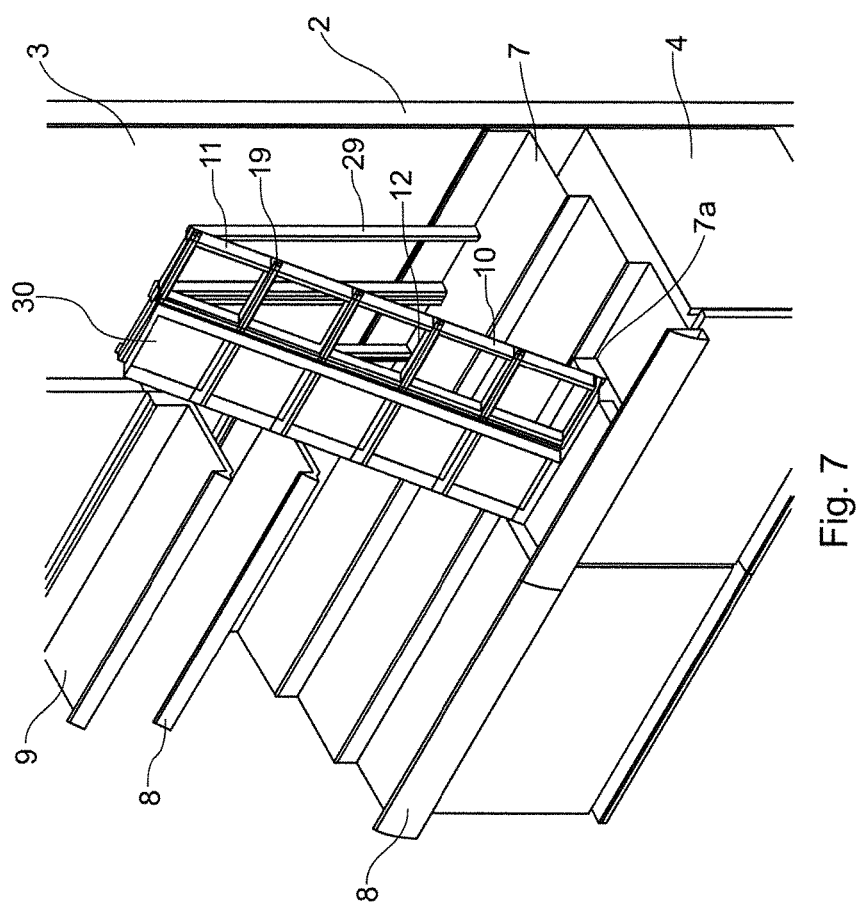
FIG. 7 shows a partial view of a display unit for products according to a further embodiment.

FIG. 7 shows a partial view of a display unit for products according to a further embodiment. According to FIG. 7, a tiered support profile 7 with a plurality of levels and a front edge 8 projecting perpendicularly is disposed on a carcass 4 with a plurality of drawers of a sales stand 2. Further shelves 9 can be fastened in the usual way to the rear wall 3 of the sales stand 2.

Figure 8:
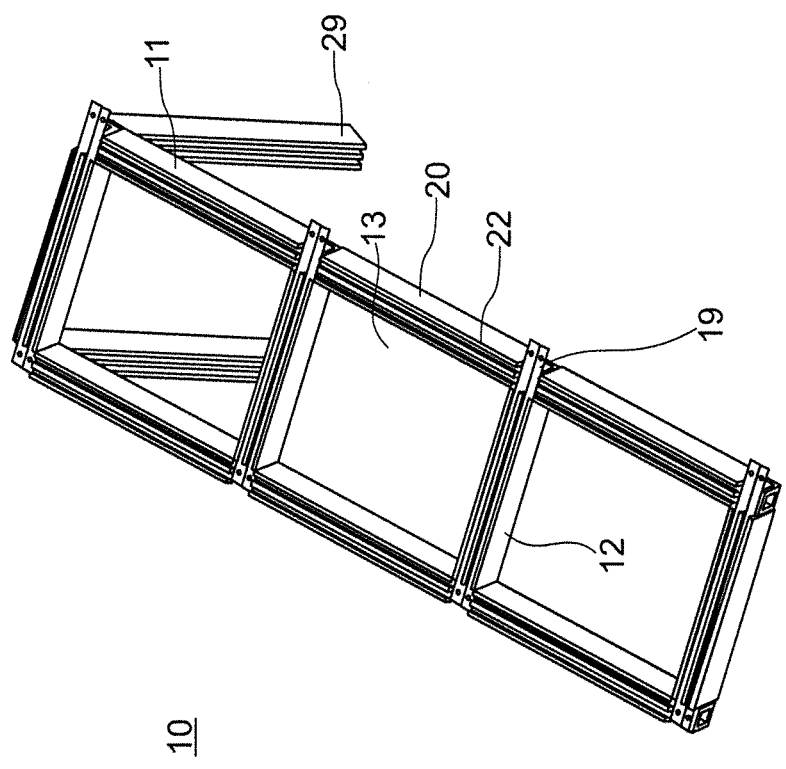
FIG. 8 shows a part of the mounting frame of the display unit according to FIG. 7.
Figure 9:
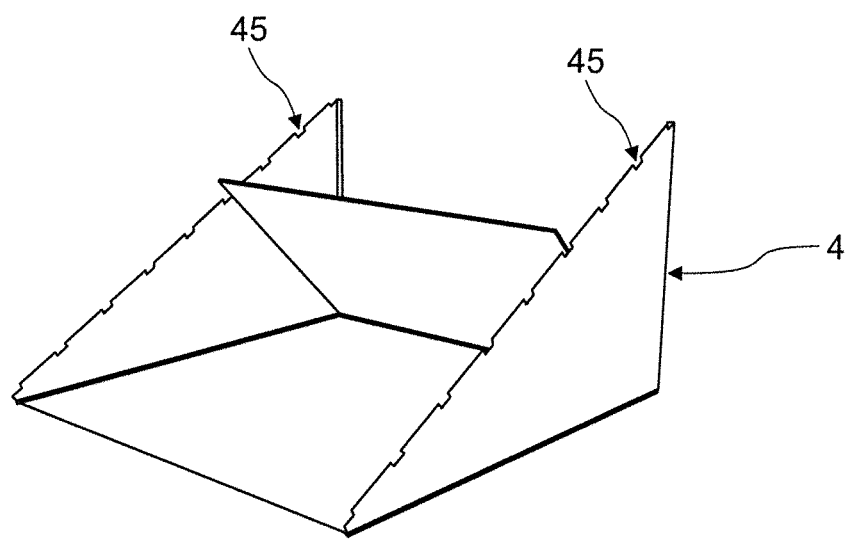
FIG. 9 shows a ramp on which a mounting frame can be disposed, in an intermediate state before the ramp is completely folded up.

An inlay rail 7a, on which the lower end of a mounting frame 10 is supported is received in the lowest level of the support profile 7. Inserts 30 are suspended or inserted in the mounting frame in the manner described above. The inserts 30 are supplied with an electric voltage by means of the conductive tracks 19 in the manner described above. The upper end of the mounting frame 10 is connected to a supporting strut 29 by means of which the mounting frame 10 also is supported on the uppermost level of the support profile 7 and on the rear face 3 of the sales stand 2. FIG. 8 shows an enlarged detail of this mounting frame 10 in the form of a ladder.

Instead of supporting the mounting frame 10 by means of the supporting strut 29 on the uppermost level of the support profile 7 and on the rear face 3 of the sales stand 2, it is also possible to provide catches on the rear faces of the vertical mounting profiles by means of which the mounting frame can be suspended directly in the front edges 8 of the shelves 9. In this way an existing sales stand 2 can be converted quickly and variably, namely by partial or complete covering by a display system consisting of a plurality of inserts 30 which are disposed in a regular arrangement by attachment or fastening on a mounting frame 10 and can be supplied automatically with a supply voltage by means of the mounting frame 10.

As can be seen readily by the person skilled in the art when studying the above description, the display system can be provided cost-effectively and attractively and can be adapted very variably to individual customer requirements. Products or text and/or graphics information can be presented in a very promotionally effective manner by the electrification of the display modules (inserts). The described display system is suitable in particular for displaying cosmetic articles with the display modules (inserts) made from plastic and using lighting effects, in particular background lighting, in at least some of the display modules (inserts). However, the display system according to the present invention can also be used correspondingly for display of any other products, for example consumer items or electronics.

Figure 10:
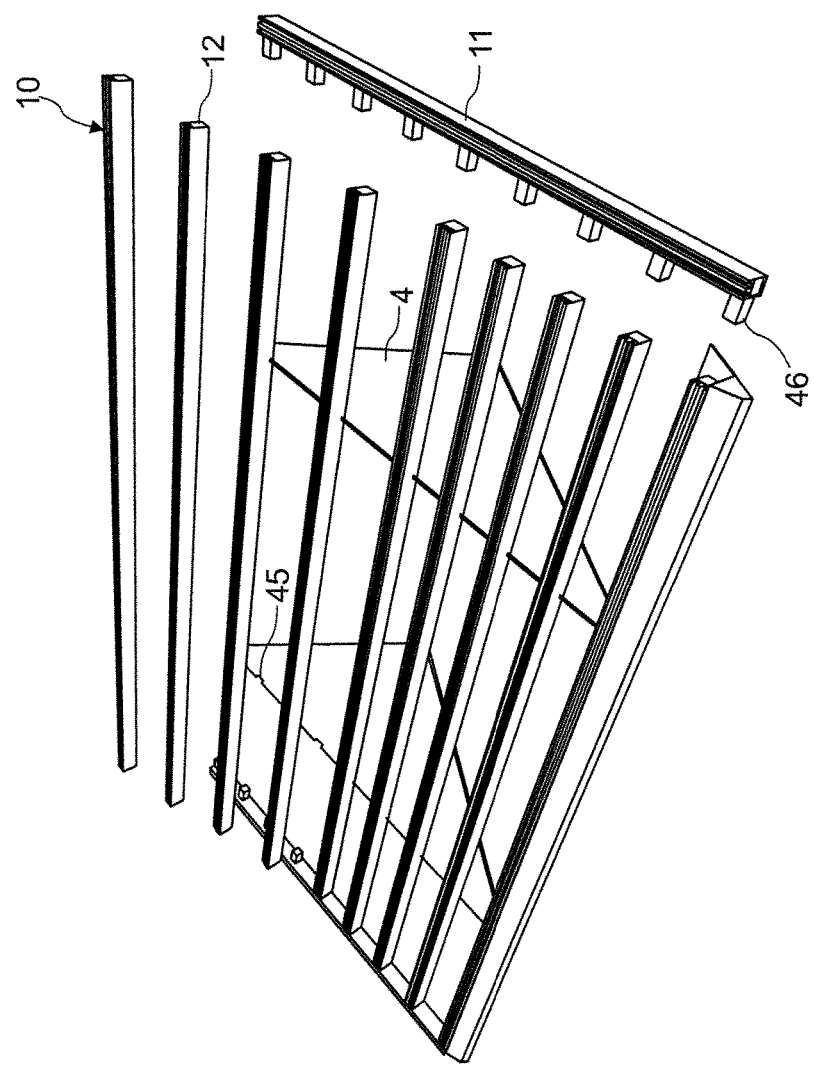
FIG. 10 shows the ramp according to FIG. 9 on which a mounting frame is disposed, which is illustrated in a partially exploded form.

In a further embodiment the carcass 4 is disposed as a collapsible ramp. A ladder structure 10 can then be fastened on this ramp, as can be seen in FIG. 10. In this case the ramp is constructed in a range from 20-80°, preferably 30-60°. Naturally, the carcass 4 can also be of solid construction and not collapsible, but this leads to a greater volume during transport. On the upper edge of the slopes the carcass 4 has openings 45 in which the horizontally extending mounting profiles of the ladder structure or of the mounting frame 10 are engaged or latched. In this way the mounting frame is prevented from sliding on the ramp-like slope.

FIG. 10 shows the mounting frame 10 which is placed onto the carcass 4, wherein the mounting frame has vertical mounting profiles 11 and horizontal mounting profiles 12 which are connected to one another by lugs 46 which extend into the profile. Because the mounting frame is disposed on the rhomboid carcass 4 a display surface is produced which rises towards the rear.

Figure 11:
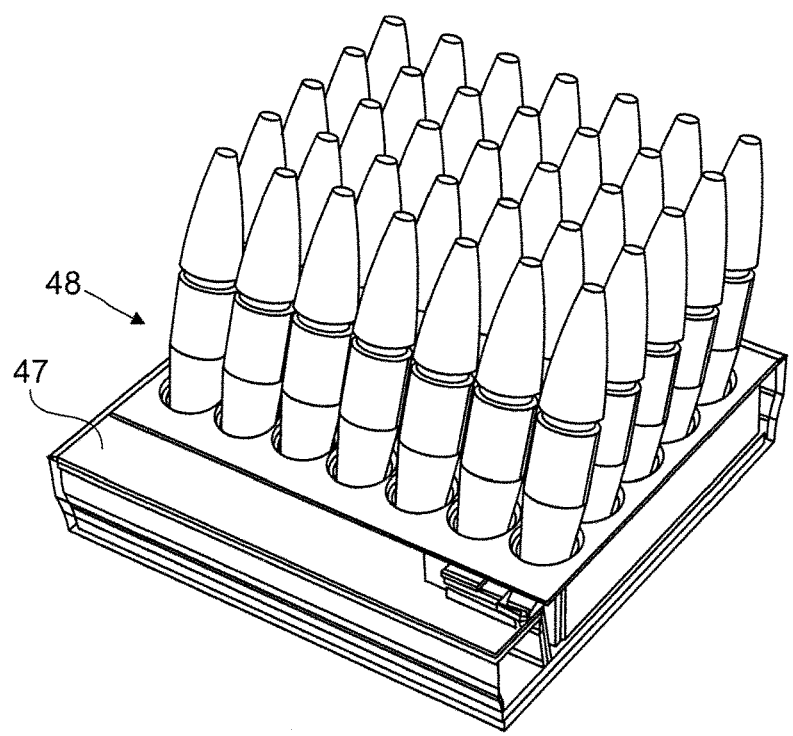
FIG. 11 shows a box-shaped insert which has receptacles in the form of holes for lipsticks, in which the lipsticks are disposed.

FIG. 11 shows a box-shaped insert which has receptacles in the form of holes for lipsticks, in which the lipsticks are disposed. Such a box-shaped insert can be disposed on a mounting frame which has a ladder structure, such as is illustrated for example in FIG. 10. A plurality of such box-shaped inserts, even if they are of different sizes, can then be disposed on such a ladder structure. As can be seen from FIG. 11, the box-shaped insert has a front region 47 in which information describing the product can be placed, and which is specially lit, and a rear region 48 in which the product described at the front is arranged.

Figure 12:
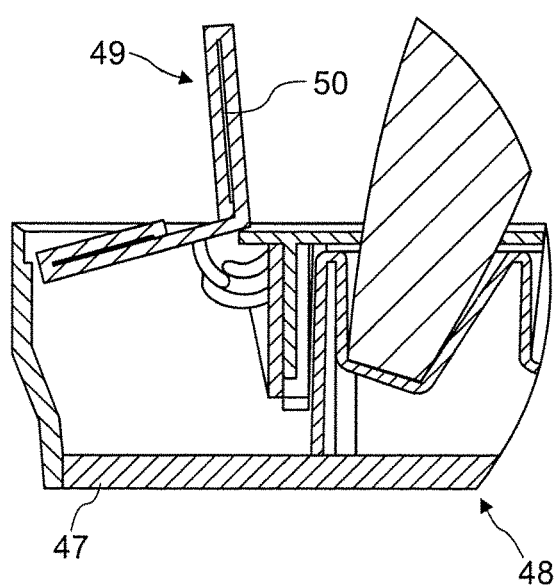
FIG. 12 shows a sectional view through the front region of the box-shaped insert, with a rotatably mounted cover which can be set at different angles.

FIG. 12 shows the front region 47 in detail, which has a rotatable cover 49 which can be set according to the inclination of the box-shaped insert in order thus to offer the viewer an optimal viewing angle. The rotatable cover 49 has a receiving slot 50 into which a piece of paper describing the product can be laid.

Figure 13:
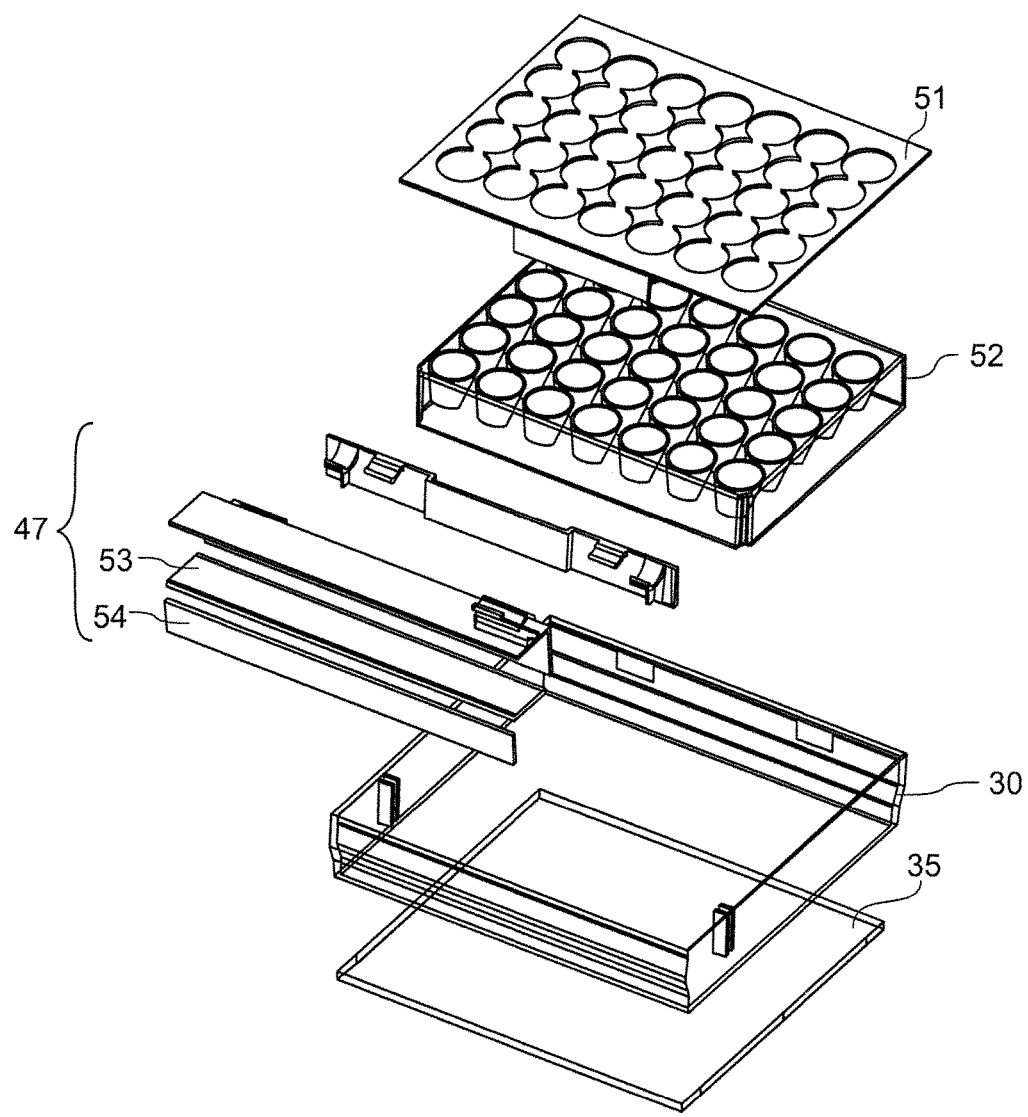
FIG. 13 shows an exploded view of a box-shaped insert.

FIG. 13 shows an exploded view of the box-shaped insert, with a cover plate 51, with a holding region 52 in which the products can be placed, and also with a front region 47 which is formed by the rotatable cover and corresponding holders, in which corresponding lenses/transparent discs 53 and 54 are formed, so that the light of the LEDs which are disposed in the base region can be guided appropriately into the front region. Furthermore an insert 30 with corresponding side walls and a base plate or a light-conducting panel 35 is provided.

Figure 14:
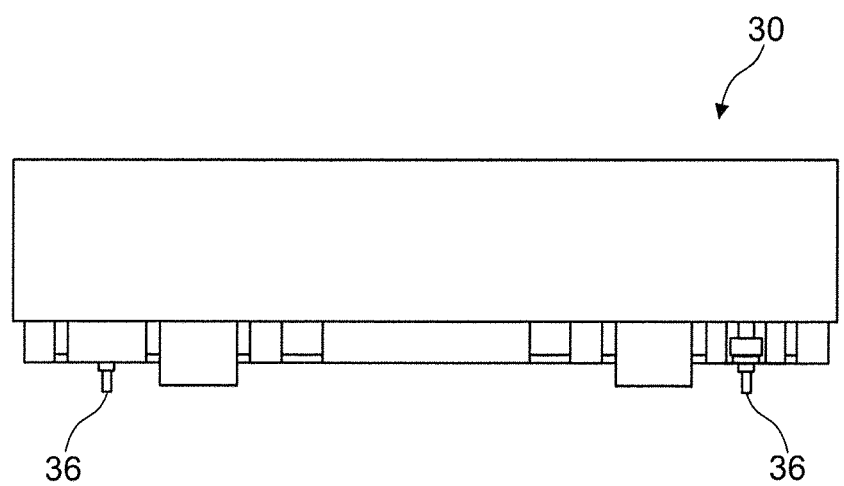
FIG. 14 shows a side view of the box-shaped insert with the contacts.

FIG. 14 shows in a side view the contacts which are usually disposed diagonally in opposite corners of the box-shaped insert and which come into contact with the mounting profiles. The pin-like contacts are usually provided with springs, so that they press onto the mounting profiles and produce a contact.

Figure 15:
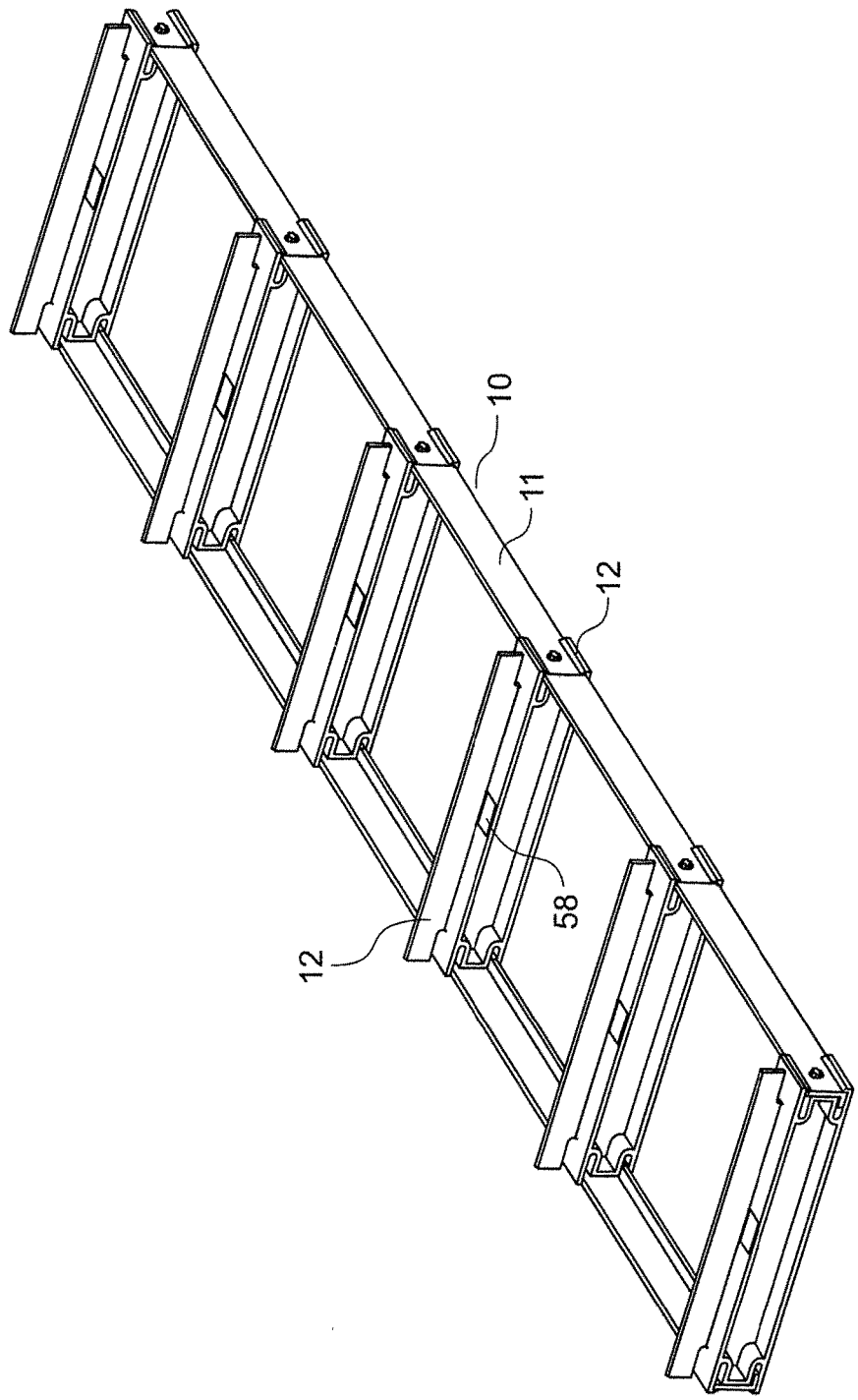
FIG. 15 shows a mounting frame, with two vertical mounting profiles as supports and a series of horizontal mounting profiles as crosspieces.
Figure 16:
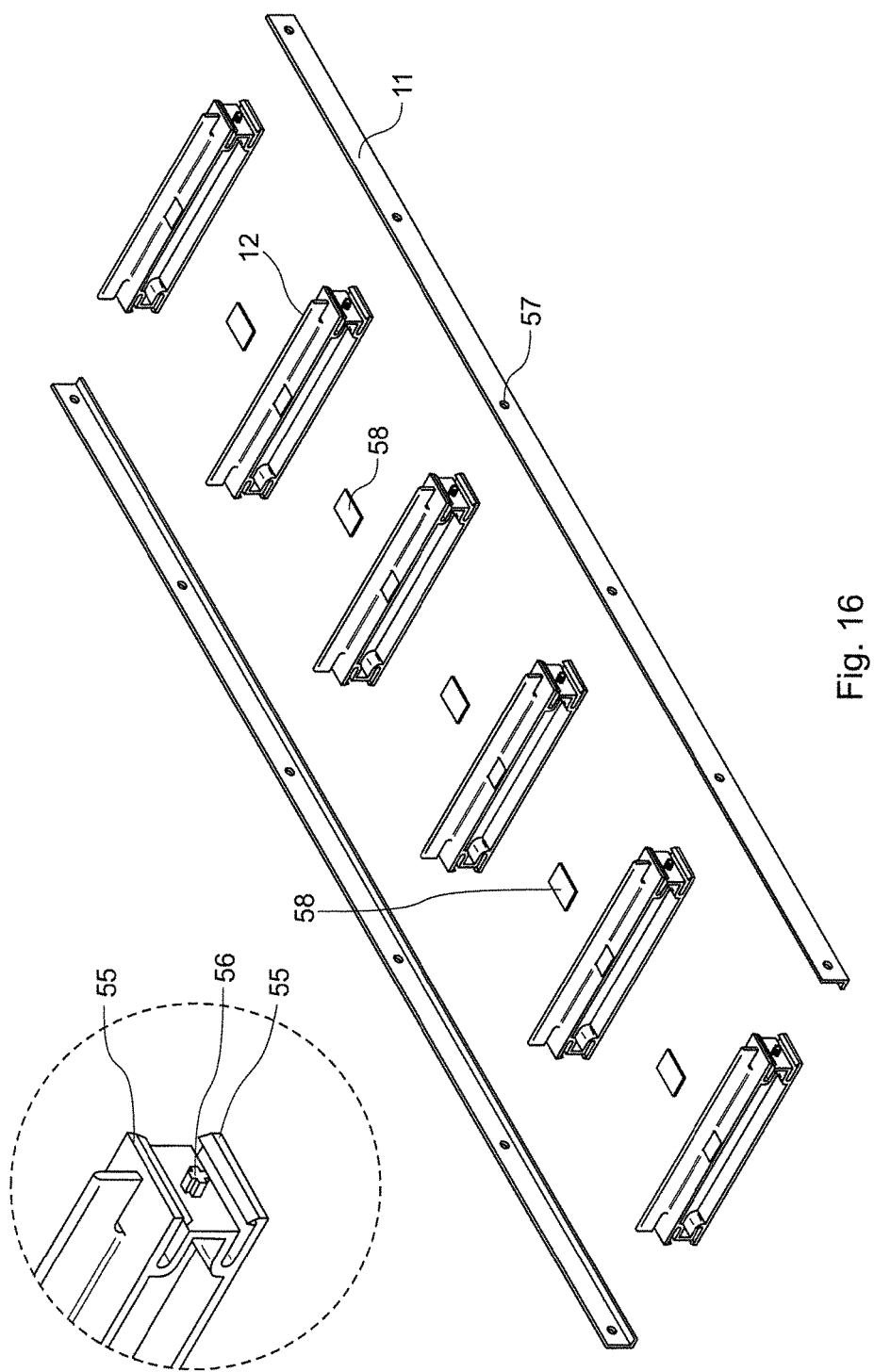
Figure 17:
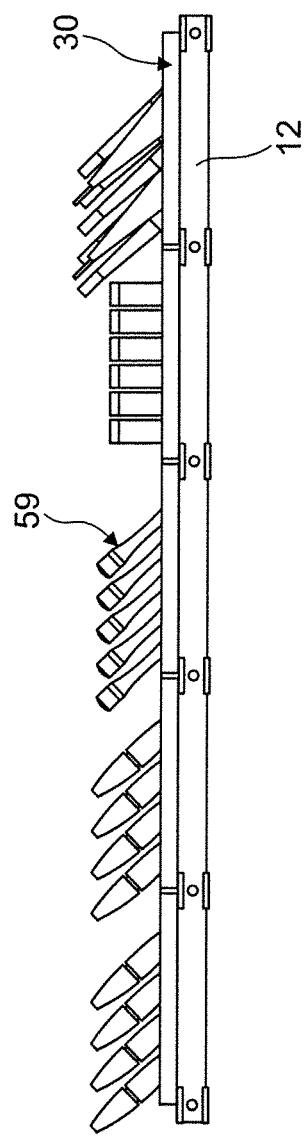
FIG. 17 shows a side view of the mounting profile of FIG. 15 with a series of box-shaped inserts which have received corresponding products.

FIG. 15 shows a ladder-like mounting frame 10 with vertical mounting profiles 11 and horizontal mounting profiles 12. The horizontal mounting profiles are preferably made from plastic and have, as FIG. 16 shows, clamping regions 55 which clamp around the vertical mounting profile and thus lock it. For this purpose two clamping elements engage from above and below around the vertical profiled section and allow it to engage behind corresponding lugs. In addition a lug 56 is also provided which extends into a hole 57 so that sliding of the horizontal mounting profile on the vertical mounting profile can be prevented. These holes can be formed in fixed grid patterns. Furthermore the horizontal mounting profiles also have magnets 58 which form a connection with the box-shaped inserts, so that the inserts cannot be easily removed from the mounting frame, but are supported stably and firmly therein. FIG. 17 shows a side view of the mounting frame 10 of FIGS. 15 and 16, wherein a plurality of box-shaped inserts, which in turn hold products, are introduced into these mounting frames.

Current can be conducted in vertical mounting profiles, since these are connected by vertical mounting profiles made from plastic and can have different polarities. The box-shaped inserts can have pins, which in each case come into contact with the vertical profiles made from metal, in order to receive voltage so that the LEDs disposed in the box-shaped inserts are supplied with voltage.

LIST OF REFERENCE NUMERALS 1 product display system
2 piece of display furniture
3 rear wall
4 carcass
5 side wall 6 upper advertising space
7 tiered support profile
7a inlay rail
8 front edge
9 shelf
10 mounting frame
11 vertical mounting profile
12 horizontal mounting profile
13 zone
14 mounting profile
15 hollow space
16a plug connector
16b plug connector
16c cross plug connector
16d angle plug connector
17 conductive track holder
18 base
19 conductive track
19a hole
20 projection
21 slope
22 longitudinal groove
23 cutout
24 projection
29 supporting strut
30 insert
31 side wall
32 rear wall
33 retaining projection
34 liner base
35 light-conducting plate
36 electrical contact pin
37 LED strips
38 LED
39 cutout
40 front cover
41 projection
42 receptacle
43 latching catch
44 slope
45 openings/cutouts
46 lug
47 front region
48 rear region
49 rotatable cover
50 receiving slot
51 cover plate
52 retaining zone
53, 54 lenses
55 clamping region
56 lug
57 hole
58 magnet

What is claimed is:

1. A display unit for products, comprising:
a mounting frame with a first plurality of mounting profiles that are disposed parallel and spaced apart from one another and a second plurality of mounting profiles parallel and spaced apart from one another and arranged to intersect the first plurality of mounting profiles to define a plurality of zones;
a conductive track holder formed in at least one mounting profile of the at least first plurality of mounting profiles and/or the second plurality of mounting profiles and extending across at least two of the plurality of zones;
at least one conductive track arranged in the conductive track holder; and
a plurality of frame-shaped or box-shaped inserts inserted into the plurality of zones and releasably fastened to the conductive track holder, the plurality of inserts having at least one conductive pin facing the conductive track holder and engaging the at least one conductive track to supply a voltage to the plurality of inserts from the conductive track when the plurality of inserts are fastened to the conductive track holder; wherein
the inserts in each case have a plurality of side walls that form a rectangular frame, and
the inserts are in each case releasably fastened by their rear faces on the mounting profiles.

2. The display unit according of claim 1, further comprising fastening elements are provided on the front faces of the mounting profiles and are designed for fastening the rear end faces of the side walls of the inserts to the mounting profiles, the fastening elements have longitudinal grooves that extend in the longitudinal direction of the respective mounting profiles and in which the conductive tracks are disposed.

3. The display unit of claim 2, wherein the rear end faces of the side walls are in each case connected by positive locking to the fastening elements.

4. The display unit of claim 3, wherein:
latching catches are provided respectively on the rear end faces of the side walls and are inserted into the longitudinal grooves of the fastening elements and elastically pretensioned against inclinations or openings of the longitudinal grooves, or
latching recesses are provided respectively on the rear end faces of the side walls and engage in the latching catches which are provided in the longitudinal grooves and are elastically pretensioned against the latching recesses
when the inserts are fastened releasably to the mounting profiles.

5. The display unit of claim 4, wherein the latching catches are formed in one piece with the side walls of the inserts or are formed with side walls of the longitudinal grooves.

6. The display unit of claim 2, wherein the fastening elements are held securely so as to be longitudinally movable on the mounting profiles.

7. The display unit of claim 1, wherein the mounting profiles are formed respectively as rectangular or square continuous hollow profiles with a cavity and wherein the mounting profiles are connected to the mounting frame by plug connectors that are inserted respectively into the cavities of two mounting profiles that are connected to one another, wherein the mounting frame has a plurality of horizontal mounting profiles extending parallel to one another and a plurality of vertical mounting profiles extending perpendicular thereto and parallel to one another.

8. The display unit of claim 1, wherein at least some of the inserts have rear walls and are designed for retaining and/or holding products to be displayed.

9. The display unit of claim 8, wherein the respective rear wall comprises a light-conducting plate or is formed thereby, into which the light for background lighting of a LED strip is coupled in.

10. The display device of claim 1, wherein the front faces of at least some of the inserts can be covered by a transparent or opaque covering, the covering being designed to present text and/or graphics information.

11. The display unit of claim 1, wherein the mounting frame is received in a piece of display furniture or is fastened to a wall panel or is fastened to a ramp-like body on which the mounting frame is disposed so as to lie obliquely.

12. The display unit of claim 1, wherein the mounting frame is formed like a ladder with horizontal and vertical mounting profiles, wherein the box-shaped inserts can be disposed in the ladder zones.

13. The display unit of claim 12, wherein the horizontal and vertical mounting profiles are connected to one another by clamping, wherein the horizontal mounting profile made from plastic and extends in part so as to clamp around the vertical mounting profile.

14. A display unit for products, comprising:
a mounting frame with a plurality of mounting profiles that are disposed parallel and spaced apart from one another and a plurality of fastening elements provided on front faces of the mounting profiles, each of the plurality of fastening elements having longitudinal grooves extending in a longitudinal direction;
conductive tracks disposed in the longitudinal grooves of at least some of the plurality of mounting profiles; and
a plurality of frame-shaped or box-shaped inserts releasably fastened to the mounting profiles, each of the plurality of inserts having a plurality of side walls that form a rectangular frame and a rear face releasably fastened to the plurality of fastening elements so that the inserts are supplied via the conductive tracks with a supply voltage to supply lighting devices and/or electrical equipment of the inserts with the supply voltage.

15. The display unit of claim 14, wherein the rear end faces of the side walls are in each case connected by positive locking to the fastening elements.

16. The display unit of claim 15, wherein:
latching catches are provided respectively on the rear end faces of the side walls and are inserted into the longitudinal grooves of the fastening elements and elastically pretensioned against inclinations or openings of the longitudinal grooves, or
latching recesses are provided respectively on the rear end faces of the side walls and engage in the latching catches which are provided in the longitudinal grooves and are elastically pretensioned against the latching recesses
when the inserts are fastened releasably to the mounting profiles.

17. The display unit of claim 16, wherein the latching catches are formed in one piece with the side walls of the inserts or are formed with side walls of the longitudinal grooves.

18. The display unit of claim 14, wherein the fastening elements are held securely so as to be longitudinally movable on the mounting profiles.

19. A display unit for products, comprising:
a mounting frame with a first plurality of mounting profiles that are disposed parallel and spaced apart from one another and a second plurality of mounting profiles parallel and spaced apart from one another and arranged to intersect the first plurality of mounting profiles to define a plurality of zones; and
a plurality of frame-shaped or box-shaped inserts inserted into the plurality of zones and releasably fastened by a magnet by their rear faces on the mounting profiles, wherein
the inserts have a plurality of side walls that form a rectangular frame.

20. The display unit of claim 1, wherein the first plurality of mounting profiles are arranged horizontally and the second plurality of mounting profiles are arranged vertically so that the mounting frame has a ladder-like shape, and wherein the plurality of frame-shaped or box-shaped inserts are disposed in the plurality of zones defined by the ladder-like mounting frame.

* * * * *